(12) United States Patent
Hsu et al.

(10) Patent No.: US 7,265,290 B1
(45) Date of Patent: Sep. 4, 2007

(54) STRUCTURE FOR ASSEMBLING COVER TO ELECTRONIC DEVICE

(75) Inventors: Yung-Chin Hsu, Taipei (TW); Lin-Wei Chang, Taipei (TW)

(73) Assignee: Inventec Corporation (TW)

( * ) Notice: Subject to any disclaimer, the term of this patent is extended or adjusted under 35 U.S.C. 154(b) by 0 days.

(21) Appl. No.: 11/391,794

(22) Filed: Mar. 28, 2006

(51) Int. Cl.
*H02G 3/14* (2006.01)
(52) U.S. Cl. .................. 174/66; 174/67; 220/241
(58) Field of Classification Search .............. 174/66, 174/67; 220/241, 242; 361/685, 752; D8/353; D13/177
See application file for complete search history.

(56) References Cited

U.S. PATENT DOCUMENTS

| | | | |
|---|---|---|---|
| 6,372,987 B1* | 4/2002 | Ha .............................. | 174/67 |
| 6,618,246 B2* | 9/2003 | Sullivan et al. ............. | 361/685 |
| 6,781,827 B2* | 8/2004 | Goodman et al. .......... | 361/685 |
| 6,852,929 B2* | 2/2005 | Scudder ...................... | 174/66 |
| 7,002,078 B2* | 2/2006 | Kunick et al. ............... | 174/66 |
| 7,151,221 B1* | 12/2006 | Backofen et al. ........... | 174/67 |

* cited by examiner

*Primary Examiner*—Dhiru R. Patel
(74) *Attorney, Agent, or Firm*—Peter F. Corless; Steven M. Jensen; Edwards Angell Palmer & Dodge LLP

(57) ABSTRACT

A structure for assembling a cover to an electronic device is provided. The electronic device has a receiving space to be covered by the cover. The cover is formed with a coupling portion on one side thereof. At least one guiding unit is formed on one side of the receiving space of the electronic device, and is provided with a first positioning portion at one end thereof. At least one sliding unit is formed on another side of the cover, and can be coupled to the guiding unit and slide in relation to the guiding unit. The sliding unit is provided with a second positioning portion at an end thereof relatively far from the coupling portion, wherein the second positioning portion can be coupled to the first positioning portion, so as to limit vertical movement of the cover in relation to the electronic device.

10 Claims, 4 Drawing Sheets

STRUCTURE FOR ASSEMBLING COVER TO ELECTRONIC DEVICE

FIELD OF THE INVENTION

The present invention relates to assembly mechanisms, and more particularly, to a structure for assembling a cover to an electronic device.

BACKGROUND OF THE INVENTION

With improvement of the technology, various kinds of electronic devices have been developed, and most electronic components disposed inside an electronic device can be inspected and replaced by removing a cover of the electronic device.

Take a server as an example, it is formed with a receiving space for storing the important electronic components such as mainboard, central processing unit (CPU) and so on, and a detachable cover is provided to cover the receiving space, so as to protect the electronic components and allow easy inspection and replacement of the electronic components. Initially, the cover is fixed to the server by screws. However, the use of many screws for fixing the cover makes attachment and detachment processes of the cover quite time-consuming and complicated. Thus, how to reduce the number of screwing elements being required for fixing the cover and to have quick and convenient attachment and detachment of the cover is a problem to be solved at that time.

Accordingly, there has been developed a method of assembling the cover to the server and then fixing them together via only a few screwing elements. Referring to FIG. 1, a cover 1 comprises a protruding portion 11 at one end thereof for being assembled to a server 2, and a hook 10 at the other end thereof for hooking a protruding piece 20 formed on a casing of the server 2, wherein the protruding piece 20 is formed by bending a rear part of the casing of the server 2 outwardly. The server 2 further comprises a supporting piece 21, which is formed by bending a side part of the casing of the server 2, for supporting the cover 1, such that the cover 1 can be fixed to the server 2 by a bolt 7.

This assembly method effectively reduces the number of screwing elements being used. However, when the assembly method is applied to some kinds of servers such as a thin server that does not have a rear part of casing, the cover cannot be properly secured to a rear side of the thin server unless additional fixing members are used, such as screws or a set of gourd-shaped holes and corresponding positioning posts. The use of screws undesirably increases the number of screwing elements being required, whereas the use of the set of gourd-shaped holes and corresponding positioning posts undesirably increases the fabrication costs.

Therefore, the problem to be solved here is to provide a structure for assembling a cover to an electronic device to overcome the above drawbacks.

SUMMARY OF THE INVENTION

In light of the above drawbacks of the prior art, an objective of the present invention is to provide a structure for assembling a cover to an electronic device, which can be widely applied to all kinds of electronic devices.

Another objective of the present invention is to provide a structure for assembling a cover to an electronic device, to make assembly and disassembly processes of the cover quick and convenient to implement.

A further objective of the present invention is to provide a structure for assembling a cover to an electronic device, to save the fabrication costs.

In accordance with the above and other objectives, the present invention provides a structure for assembling a cover to an electronic device, the electronic device having a receiving space to be covered by the cover, and the cover having a coupling portion formed on one side thereof. The structure comprises at least one guiding unit disposed on one side of the receiving space of the electronic device, and being formed with a first positioning portion at one end thereof; and at least one sliding unit disposed on another side of the cover, for being coupled to the guiding unit and capable of sliding in relation to the guiding unit, wherein the sliding unit is formed with a second positioning portion at an end thereof relatively far from the coupling portion, and the second positioning portion corresponds to and is for being coupled to the first positioning portion of the guiding unit, so as to limit vertical movement of the cover in relation to the electronic device.

The electronic device can be a server, a personal computer, a laptop computer or a portable electronic device, and the receiving space is for receiving electronic components.

Preferably, the guiding unit is a guiding groove formed of a bent board, and the sliding unit is a sliding track for being coupled to the guiding groove. The first positioning portion is a clip, and the second positioning portion is a protruding portion such as a protruding block, wherein the protruding block can be coupled to the clip and clamped by the clip. The coupling portion of the cover is a protruding portion such as a protruding strip, for being coupled to a casing of the electronic device. When the protruding strip is coupled to the casing, the second positioning portion position can be simultaneously coupled to the first positioning portion. In other words, when the sliding track is engaged with the guiding groove and slides in the guiding groove to make the coupling portion fixed to the electronic device, the coupling between the first positioning portion and the second positioning portion can be accomplished simultaneously, such that the cover is assembled to the electronic device.

Additionally, the coupling portion of the cover is further formed with a screw hole, and the electronic device is formed with an installing hole communicating with the screw hole. Thus, the cover can be fixed to the electronic device by screwing a bolt to the installing hole and the screw hole.

Compared with the prior art that has limitation in the application range, the structure for assembling a cover to an electronic device according to the present invention can be widely applied to all kinds of electronic devices.

Besides, the structure for assembling a cover to an electronic device according to the present invention has a design of allowing the sliding track to slide in the guiding groove, which enables the cover to be quickly assembled to the electronic device.

Furthermore, the structure for assembling a cover to an electronic device according to the present invention uses simple arrangement of the first and second positioning portions, which is cost-effective to implement, as compared to the prior art using the cost-ineffective arrangement of gourd-shaped holes and corresponding positioning posts.

Therefore, the structure for assembling a cover to an electronic device according to the present invention can be widely applied to all kinds of electronic devices and overcome the drawbacks of the prior art, thereby having high practicability.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a structure for assembling a cover to an electronic device according to the present invention are described as follows with reference to FIGS. 2 to 4. It is to be noted that the drawings are simplified schematic diagrams and only show components relating to the present invention. In practice, the layout of components could be more complicated. It should be understood that the following embodiments are not construed to limit the scope of the present invention.

Figure 1:
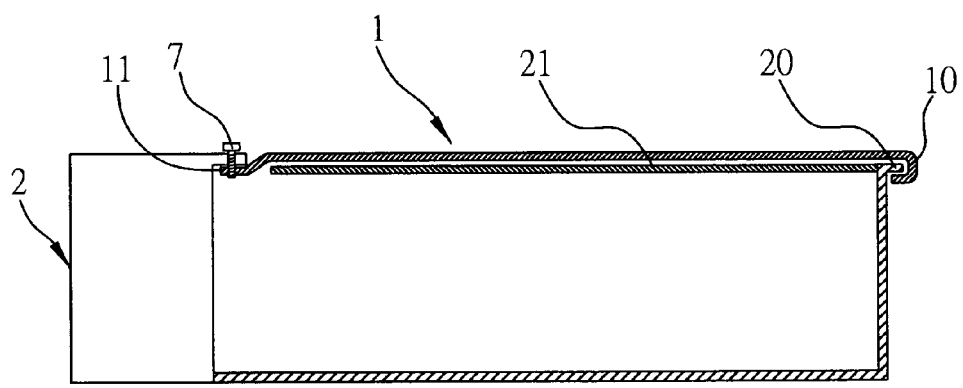
FIG. 1 (PRIOR ART) is a cross-sectional view of a conventional assembly structure of a cover and a server.
Figure 2:
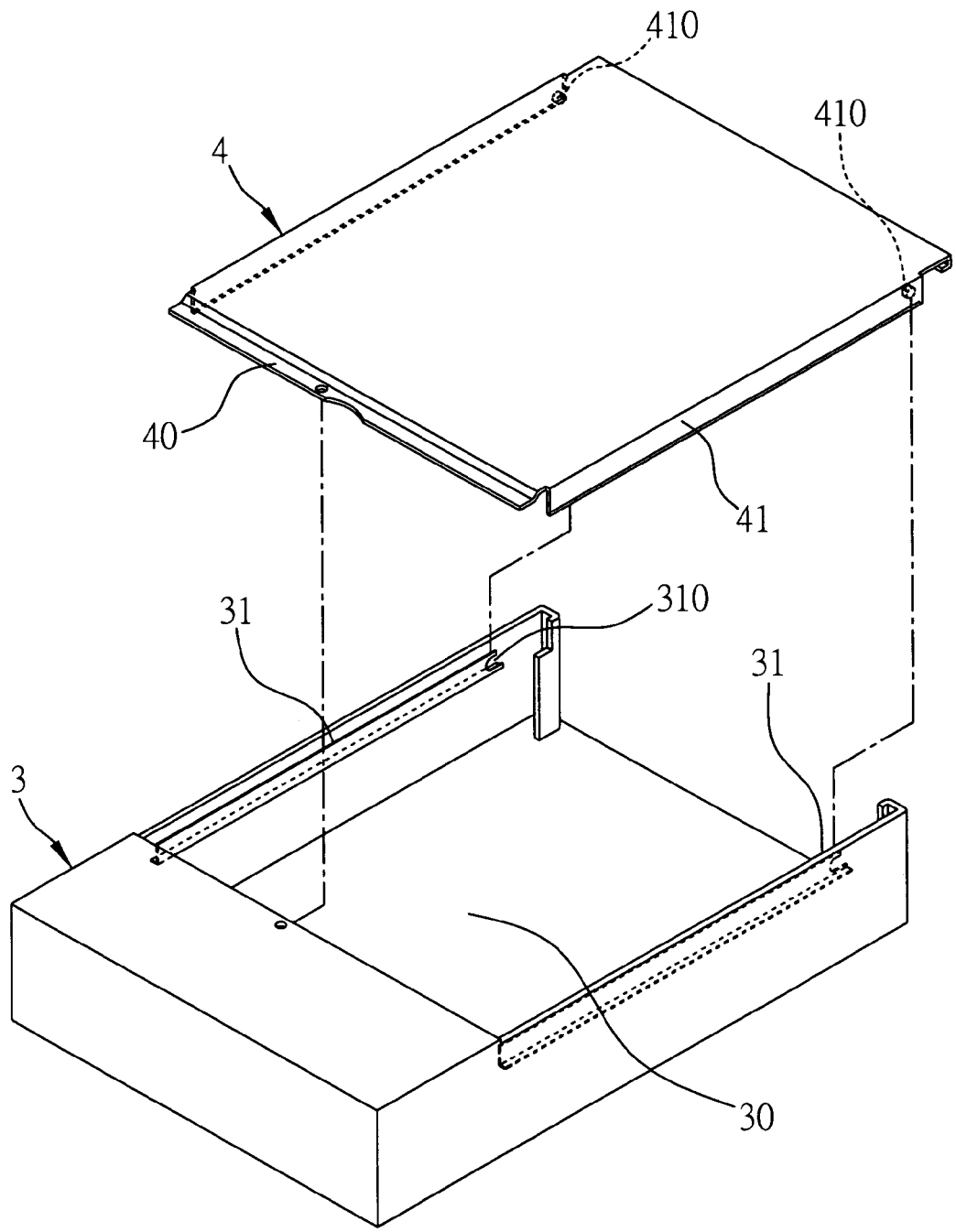
FIG. 2 is an exploded view of a structure for assembling a cover to an electronic device according to a preferred embodiment of the present invention.

Referring to FIG. 2, the structure for assembling a cover 4 to an electronic device 3 according to the present invention is illustrated, wherein the electronic device 3 has a receiving space 30 to be covered by the cover 4.

The electronic device 3 can be a server, a personal computer, a laptop computer or a portable electronic device, and the receiving space 30 formed in the electronic device 3 is used to receive electronic components. Two guiding units 31 are respectively formed on two opposite sides of the receiving space 30 of the electronic device 3, and a first positioning portion 310 is formed at one end of each of the guiding units 31.

The cover 4 can cover the receiving space 30 of the electronic device 3. A coupling portion 40 is formed on one side of the cover 4 and can be coupled to the electronic device 3. Two sliding units 41 are respectively formed on two other opposite sides of the cover 4, and can be coupled to the two guiding units 31 respectively and slide in relation to the corresponding guiding units 31. Each of the sliding units 41 is formed with a second positioning portion 410 at an end thereof relatively far from the coupling portion 40, wherein the second positioning portion 410 corresponds to the first positioning portion 310 of each of the guiding units 31 and can be coupled to the corresponding first positioning portion 310, so as to limit vertical movement of the cover 4 in relation to the electronic device 3, and assemble the cover 4 to the electronic device 3.

Figure 3:
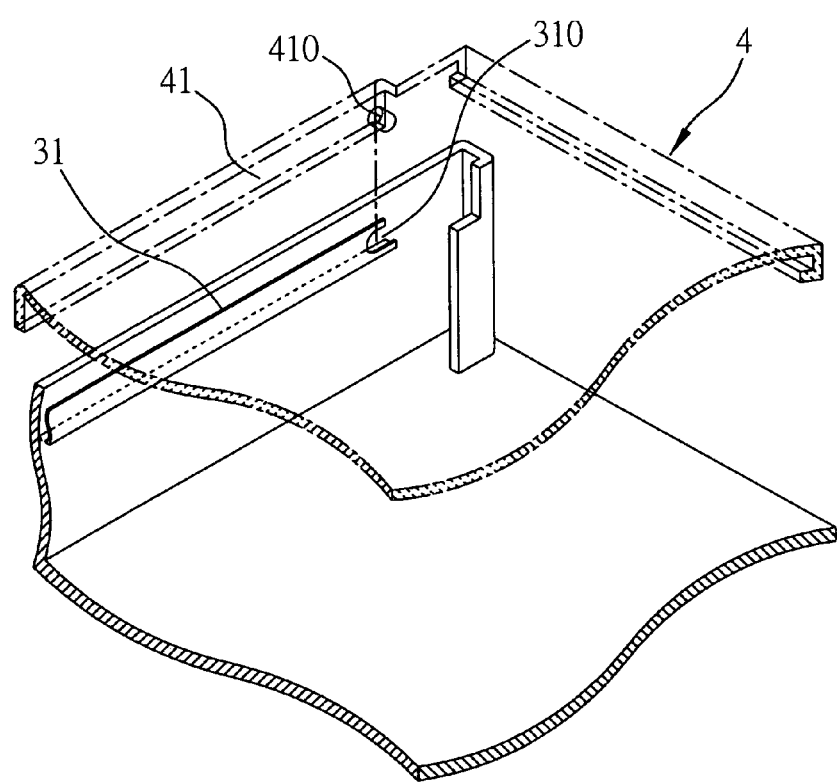
FIG. 3 is an exploded partial view of the structure for assembling a cover to an electronic device according to the present invention.

FIG. 3 is an exploded partial view of the structure of the present invention. It should be noted that, since the guiding unit 31, the sliding unit 41, the first positioning portion 310 and the second positioning portion 410 provided on one of the two opposite sides of the electronic device 3 and cover 4 are structurally same as those provided on the other one of the two opposite sides, therefore, FIG. 3 only shows one of the sides with those components. As shown in FIG. 3, the guiding unit 31 can be a guiding groove 31 formed of a bent board, and the sliding unit 41 can be a sliding track 41 for being coupled to the guiding groove. The first positioning portion 310 can be a clip 310, and the second positioning portion 410 can be a protruding portion 410 such as a protruding block, wherein the protruding block can be coupled to the clip and clamped by the clip.

Figure 4:
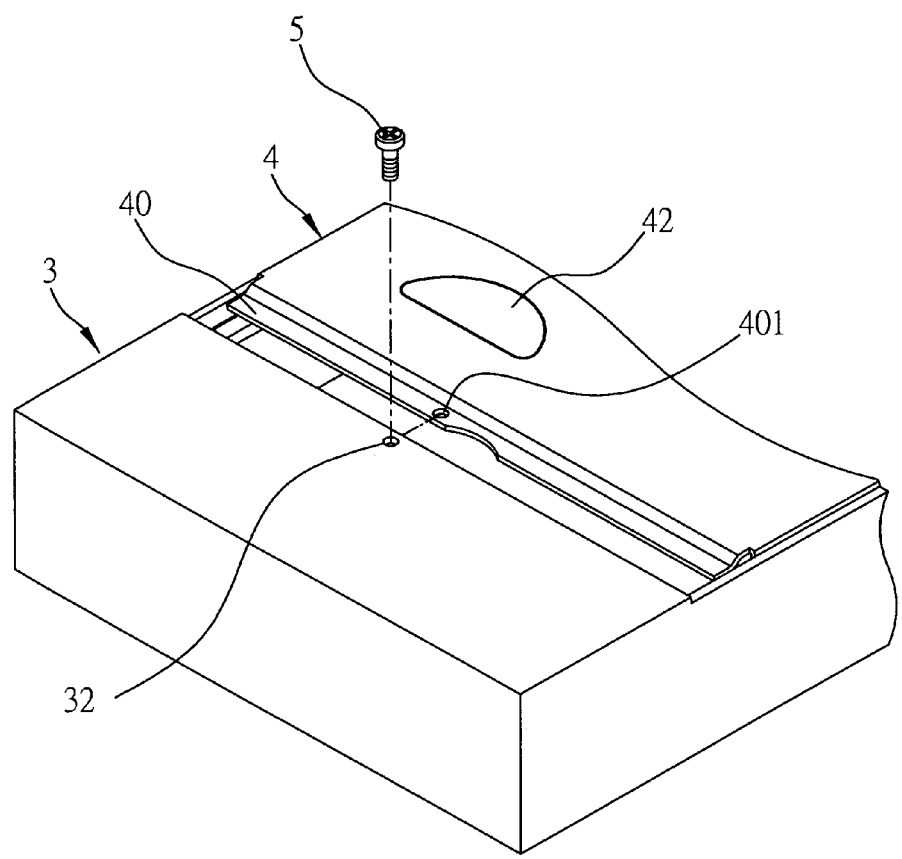
FIG. 4 is a partial schematic diagram of assembly of the cover and the electronic device in the use of the structure according to the present invention.

As shown in FIG. 4, the coupling portion 40 of the cover 4 can be a protruding portion such as a protruding strip, for being coupled to a casing of the electronic device 3. When the coupling portion 40 is coupled to the electronic device 3, the second positioning portions 410 of the sliding units 41 can be coupled to and positioned at the first positioning portions 310 of the guiding units 31 simultaneously. In other words, when the sliding units 41 of the cover 4 are coupled to the guiding units 31 and slide in relation to the guiding units 31 to make the coupling portion 40 fixed to the electronic device 3, the coupling between the first positioning portions 310 and the second positioning portions 410 can be accomplished simultaneously, such that the cover 4 is assembled to the electronic device 3.

In addition, an operating portion 42, such as a plastic piece, can be further formed on a surface of the cover 4, to increase friction and allow convenient operation of the cover 4 for a user.

Furthermore, the coupling portion 41 of the cover 4 is further formed with a screw hole 401 and the electronic device 3 is formed with an installing hole 32 communicating with the screw hole 401. Thus, the cover 4 can be fixed to the electronic device 3 by screwing a bolt 5 to the installing hole 32 and the screw hole 401.

Compared with the prior art that has limitation in the application range, the structure for assembling a cover to an electronic device according to the present invention can be widely applied to all kinds of electronic devices, such that an electronic device without a rear part of casing can be securely assembled with a cover through the use of the structure of the present invention.

Besides, the structure for assembling a cover to an electronic device according to the present invention has a design of allowing the sliding tracks to slide in the guiding grooves, which enables the cover to be quickly assembled to the electronic device.

Furthermore, the structure for assembling a cover to an electronic device according to the present invention uses simple arrangement of the first and second positioning portions, which is cost-effective to implement, as compared to the prior art using the cost-ineffective arrangement of gourd-shaped holes and corresponding positioning posts.

Therefore, the structure for assembling a cover to an electronic device according to the present invention can be widely applied to all kinds of electronic devices and overcome the drawbacks of the prior art, thereby having high practicability.

The present invention has been described using exemplary preferred embodiments above, however, it is to be understood that the scope of the present invention is not limited to the disclosed embodiments. On the contrary, it is intended to cover various modifications and similar changes. The scope of the claims, therefore, should be accorded the broadest interpretation so as to encompass all such modifications and similar arrangements.

What is claimed is:

1. A structure for assembling a cover to an electronic device, the electronic device having a receiving space to be covered by the cover, and the cover having a coupling portion formed on one side thereof, the structure comprising:

at least one guiding unit disposed on one side of the receiving space of the electronic device, and being formed with a first positioning portion at one end thereof; and at least one sliding unit disposed on another side of the cover, for being coupled to the guiding unit and capable of sliding in relation to the guiding unit, wherein the sliding unit is formed with a second positioning portion at an end thereof relatively far from the coupling portion, and the second positioning portion corresponds to and is for being coupled to the first positioning portion of the guiding unit, so as to limit vertical movement of the cover in relation to the electronic device.

2. The structure of claim 1, wherein the electronic device is one of a server, a personal computer, a laptop computer and a portable electronic device, and the receiving space is for receiving electronic components.

3. The structure of claim 1, wherein the guiding unit is a guiding groove formed of a bent board, and the sliding unit is a sliding track for being coupled to the guiding groove.

4. The structure of claim 1, wherein the first positioning portion is a clip and the second positioning portion is a protruding portion for being clamped by the clip.

5. The structure of claim 1, wherein the coupling portion is a protruding portion for being coupled to a casing of the electronic device.

6. The structure of claim 1, wherein when the coupling portion is coupled to the electronic device, the second positioning portion is coupled to the first positioning portion.

7. The structure of claim 1, further comprising a screw hole formed in the coupling portion, and an installing hole formed on the electronic device and communicating with the screw hole.

8. The structure of claim 7, further comprising a bolt for being coupled to the screw hole and the installing hole so as to fix the cover to the electronic device.

9. The structure of claim 1, further comprising an operating portion formed on the cover, for allowing convenient operation of the cover.

10. The structure of claim 9, wherein the operating portion is a plastic piece for increasing friction.

* * * * *